US012566267B2

(12) United States Patent
Chen et al.

(10) Patent No.: US 12,566,267 B2
(45) Date of Patent: Mar. 3, 2026

(54) LIDAR SYSTEM AND OPERATION METHOD OF THE SAME

(71) Applicant: HON HAI PRECISION INDUSTRY CO., LTD., New Taipei City (TW)

(72) Inventors: Jun-Da Chen, New Taipei City (TW); Hao-Chung Kuo, New Taipei City (TW); Kuo-Fong Tseng, New Taipei City (TW)

(73) Assignee: HON HAI PRECISION INDUSTRY CO., LTD., New Taipei City (TW)

( * ) Notice: Subject to any disclaimer, the term of this patent is extended or adjusted under 35 U.S.C. 154(b) by 200 days.

(21) Appl. No.: 18/486,177

(22) Filed: Oct. 13, 2023

(65) Prior Publication Data

US 2025/0012921 A1 Jan. 9, 2025

(30) Foreign Application Priority Data

Jul. 5, 2023 (TW) ................................. 112125131

(51) Int. Cl.
*G01S 17/26* (2020.01)
*G01S 7/484* (2006.01)
(Continued)

(52) U.S. Cl.
CPC .............. *G01S 17/26* (2020.01); *G01S 7/484* (2013.01); *G01S 7/487* (2013.01); *G01S 17/42* (2013.01);
(Continued)

(58) Field of Classification Search
CPC .......... G01S 17/26; G01S 17/42; G01S 7/484; G01S 7/4865; G01S 7/487
(Continued)

(56) References Cited

U.S. PATENT DOCUMENTS

| | | | |
|---|---|---|---|
| 5,835,199 A * | 11/1998 | Phillips | G01S 7/484 |
| | | | 356/28.5 |
| 11,675,060 B2 * | 6/2023 | Mendel | G01S 7/487 |
| | | | 356/5.01 |

(Continued)

FOREIGN PATENT DOCUMENTS

| | | |
|---|---|---|
| CN | 108828534 A | 11/2018 |
| CN | 113933852 A | 1/2022 |

(Continued)

OTHER PUBLICATIONS

Chia-Ming Tsai and Yung-Chien Liu, "Anti-interference single-photon LiDAR using stochastic pulse position modulation", Optics Letters, vol. 45, No. 2, Jan. 15, 2020, pp. 439-442.

(Continued)

*Primary Examiner* — Bharat Barot
(74) *Attorney, Agent, or Firm* — CKC & Partners Co., LLC

(57) ABSTRACT

A LIDAR system comprises a chaotic signal generating device, a signal transmitting device and a signal processing system sequentially coupled in series. The chaotic signal generating device is configured to generate a chaotic signal and comprises a feedback device and a laser generator configured to generate a laser signal. The feedback device is configured to receive the laser signal, generate the chaotic signal and a feedback signal according to a laser signal, and transmit the adjusted feedback signal to the laser generator. The signal transmitting device is configured to receive the chaotic signal, so as to generate a reference signal and detection signal, wherein the detection signal is transformed into a reflected signal after being reflected by an obstacle. The signal processing system is configured to receive the reference signal and the reflected signal, so as to determine (Continued)

a delay time by using a frequency domain phase modulation algorithm.

15 Claims, 11 Drawing Sheets

(51) Int. Cl.

| | | |
|---|---|---|
| *G01S 7/4865* | (2020.01) | |
| *G01S 7/487* | (2006.01) | |
| *G01S 17/42* | (2006.01) | |
| *H02M 1/084* | (2006.01) | |
| *H10F 30/225* | (2025.01) | |

(52) U.S. Cl.
CPC ........ *H02M 1/0845* (2013.01); *H10F 30/225* (2025.01)

(58) Field of Classification Search
USPC .................................................. 380/260, 263
See application file for complete search history.

(56) References Cited

U.S. PATENT DOCUMENTS

| | | | | |
|---|---|---|---|---|
| 12,105,196 | B2 * | 10/2024 | Shin ......................... | G01S 17/42 |
| 12,416,728 | B2 * | 9/2025 | Fitelson ..................... | G01S 7/48 |
| 12,436,287 | B1 * | 10/2025 | Yang ........................ | G01S 7/484 |
| 2006/0258298 | A1 * | 11/2006 | Kim ................... | H04B 17/0085 455/69 |

| | | | | |
|---|---|---|---|---|
| 2019/0170857 | A1 | 6/2019 | Nakajima et al. | |
| 2020/0374002 | A1 * | 11/2020 | Wang ..................... | H04B 10/25 |
| 2022/0244378 | A1 | 8/2022 | Lesso et al. | |
| 2022/0413354 | A1 | 12/2022 | Lukashchuk et al. | |
| 2023/0273314 | A1 * | 8/2023 | Bottacchi ................ | G01S 7/484 356/5.01 |
| 2024/0337479 | A1 * | 10/2024 | Grieco .................... | G01S 17/89 |

FOREIGN PATENT DOCUMENTS

| | | |
|---|---|---|
| CN | 114024662 A | 2/2022 |
| CN | 114814856 A | 7/2022 |
| CN | 115015951 A | 9/2022 |
| CN | 112688166 B | 10/2022 |
| WO | 2022048254 A1 | 3/2022 |
| WO | 2023059850 A1 | 4/2023 |

OTHER PUBLICATIONS

Bo Liu et al., "True random coded photon counting Lidar", Opto-Electron Advances, vol. 3, No. 2, 2020, DOI: 10.29026/oea.2020. 190044.
Linas Svilainis et al., "Subsample interpolation bias error in time of flight estimation by direct correlation in digital domain", Measurement, vol. 46, Issue 10, 2013, pp. 3950-3958.
Jun-Da Chen et al., "3D chaos lidar system with a pulsed master oscillator power amplifier scheme" Opt. Express, vol. 29, No. 17, Aug. 16, 2021, pp. 27871-27881.
Hsin-Lin Ho et al., "High-speed 3D imaging using a chaos lidar system", The European Physical Journal Special Topics, 2022.

* cited by examiner

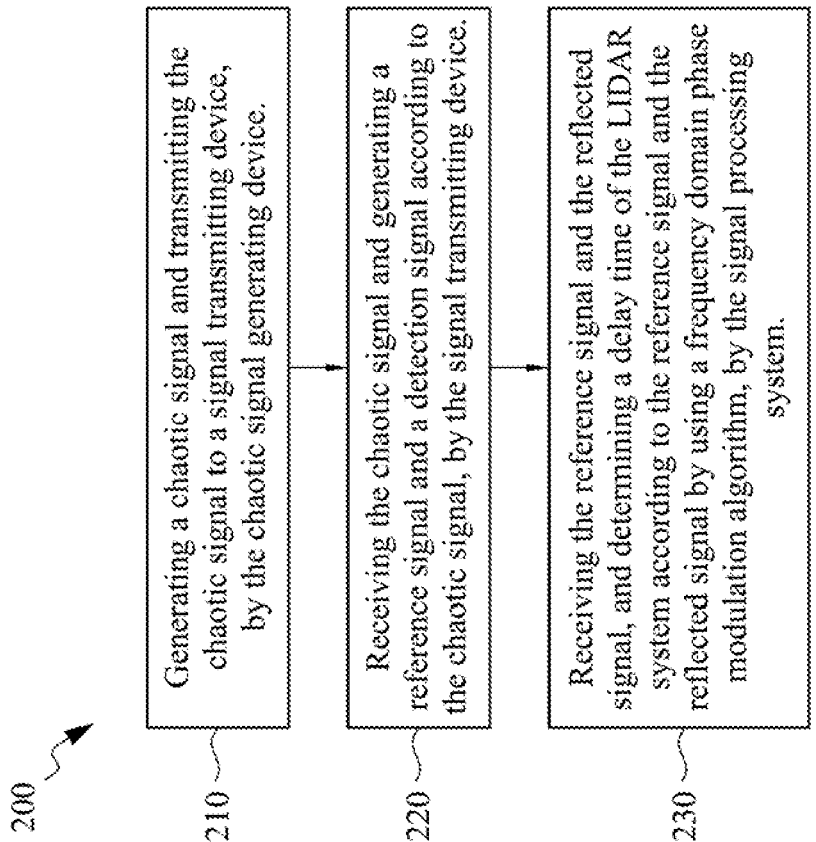

200

210 — Generating a chaotic signal and transmitting the chaotic signal to a signal transmitting device, by the chaotic signal generating device.

220 — Receiving the chaotic signal and generating a reference signal and a detection signal according to the chaotic signal, by the signal transmitting device.

230 — Receiving the reference signal and the reflected signal, and determining a delay time of the LIDAR system according to the reference signal and the reflected signal by using a frequency domain phase modulation algorithm, by the signal processing system.

211 — Generating a laser signal to a feedback device by a laser generator.

212 — Receiving the laser signal, generating the chaotic signal and a feedback signal according to the laser signal, and transmitting the adjusted feedback signal to the laser generator, by the feedback device.

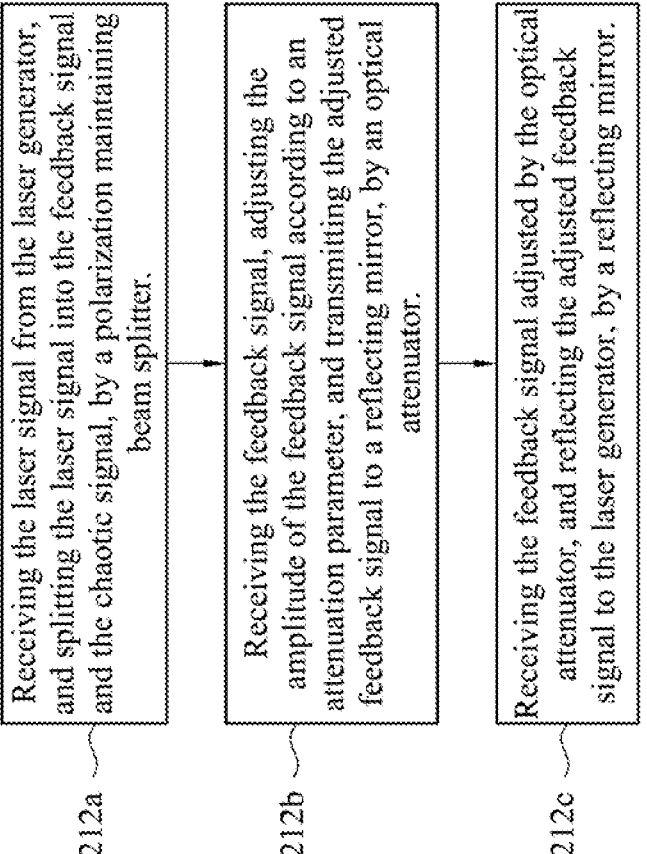

212

212a — Receiving the laser signal from the laser generator, and splitting the laser signal into the feedback signal and the chaotic signal, by a polarization maintaining beam splitter.

212b — Receiving the feedback signal, adjusting the amplitude of the feedback signal according to an attenuation parameter, and transmitting the adjusted feedback signal to a reflecting mirror, by an optical attenuator.

212c — Receiving the feedback signal adjusted by the optical attenuator, and reflecting the adjusted feedback signal to the laser generator, by a reflecting mirror.

Fig. 2C

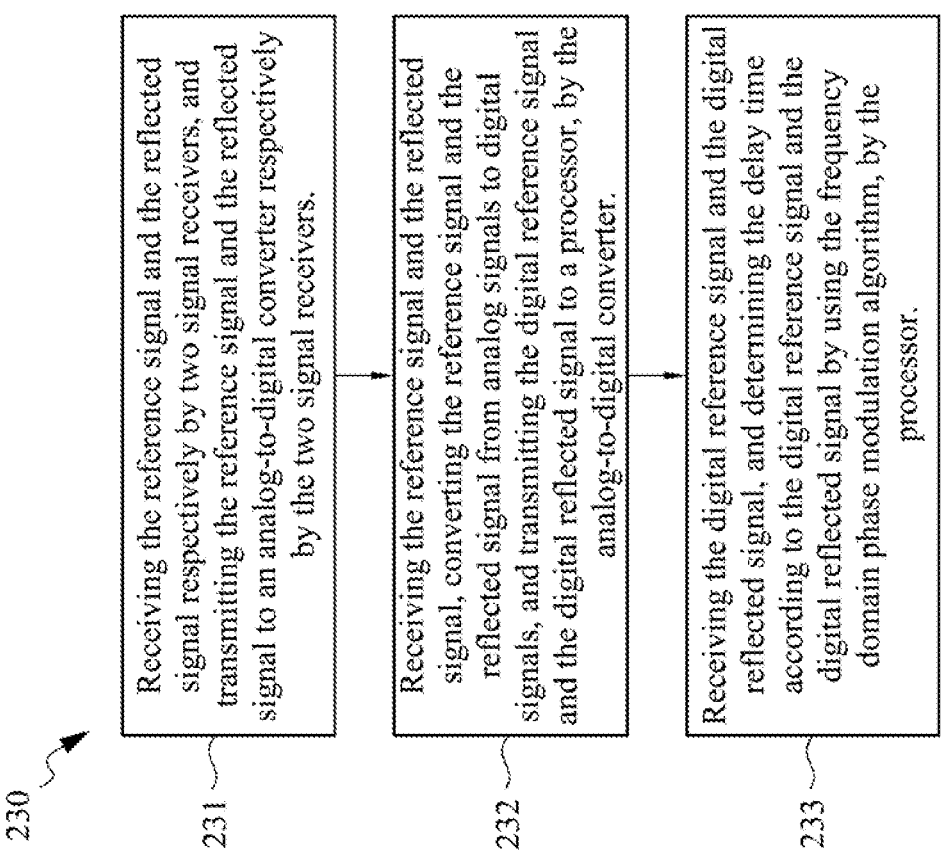

230

231 Receiving the reference signal and the reflected signal respectively by two signal receivers, and transmitting the reference signal and the reflected signal to an analog-to-digital converter respectively by the two signal receivers.

232 Receiving the reference signal and the reflected signal, converting the reference signal and the reflected signal from analog signals to digital signals, and transmitting the digital reference signal and the digital reflected signal to a processor, by the analog-to-digital converter.

233 Receiving the digital reference signal and the digital reflected signal, and determining the delay time according to the digital reference signal and the digital reflected signal by using the frequency domain phase modulation algorithm, by the processor.

Fig. 2E

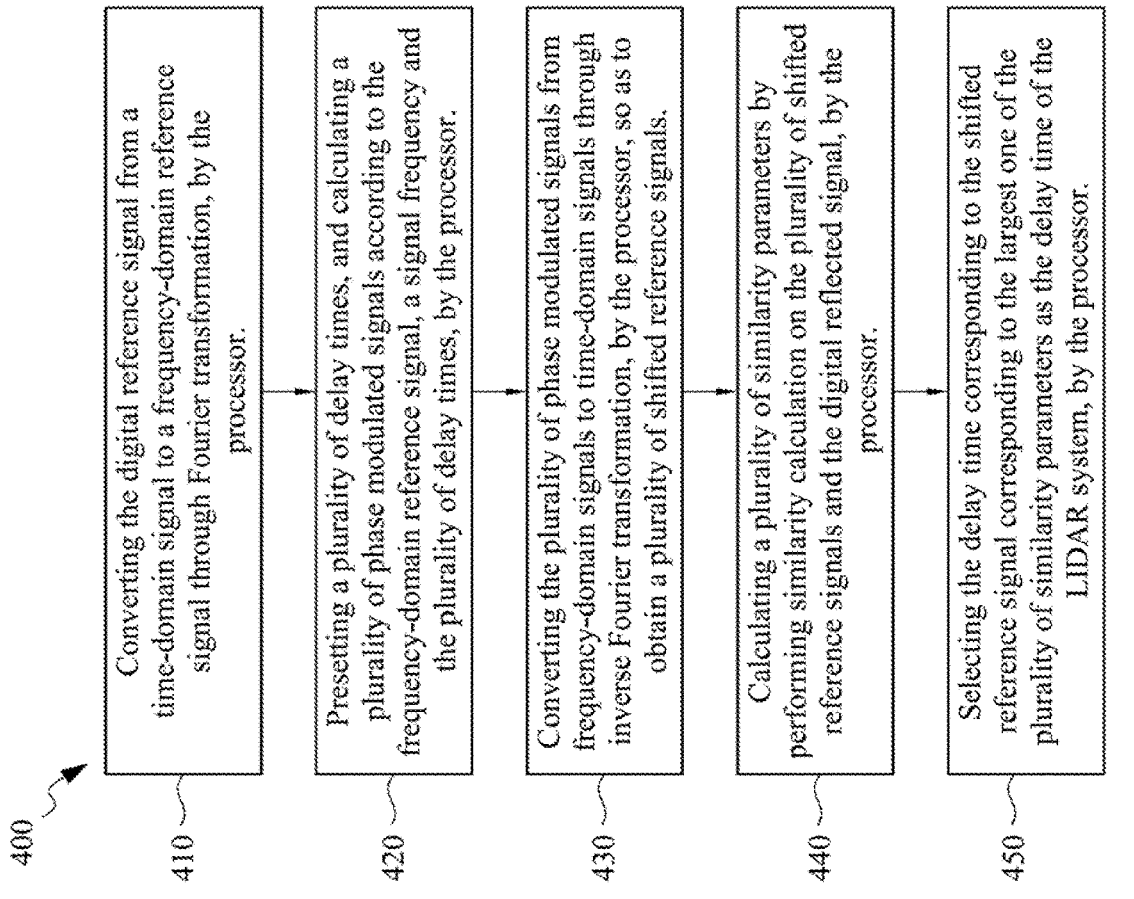

400

410 Converting the digital reference signal from a time-domain signal to a frequency-domain reference signal through Fourier transformation, by the processor.

420 Presetting a plurality of delay times, and calculating a plurality of phase modulated signals according to the frequency-domain reference signal, a signal frequency and the plurality of delay times, by the processor.

430 Converting the plurality of phase modulated signals from frequency-domain signals to time-domain signals through inverse Fourier transformation, by the processor, so as to obtain a plurality of shifted reference signals.

440 Calculating a plurality of similarity parameters by performing similarity calculation on the plurality of shifted reference signals and the digital reflected signal, by the processor.

450 Selecting the delay time corresponding to the shifted reference signal corresponding to the largest one of the plurality of similarity parameters as the delay time of the LIDAR system, by the processor.

Fig. 4

LIDAR SYSTEM AND OPERATION METHOD OF THE SAME

RELATED APPLICATIONS

This application claims priority to Taiwan Application Serial Number 112125131, filed on Jul. 5, 2023, which is herein incorporated by reference in its entirety.

BACKGROUND

Technical Field

Present disclosure is related to a LIDAR system and an operation method of the same. More particularly, the present disclosure is related to a LIDAR system integrating a pulsed chaotic signal structure hardware and a phase modulation algorithm software, and an operation method of the same.

Description of Related Art

Light detection and ranging (LIDAR) is widely used in object detecting technologies (e.g., autonomous driving, unmanned vehicles, etc.) due to its high precision, high resolution and long sensing distance.

Traditional LIDAR systems modulate the emitted pulse signals to generate highly random signals, thereby avoiding mutual influence between different LIDARs. However, if a random timing modulation is performed on a repetitive pulse signal, the transmission time intervals of the pulse signal will not be fixed, which is not conducive to producing images with uniform resolution. In another modulation method, a high-speed modulator is used to modulate the laser signal, but due to the large limitation on the number of signal groups and the length of signals, the scalability is not good, and the cost of the LIDAR system will also significantly increase.

On the other hand, the accuracy of the LIDAR system depends on the sampling frequency of the analog-to-digital converter (ADC) in the system. In general, in order to save the cost of the LIDAR system, a lower sampling frequency is used to calculate the delay time and delay distance, and an interpolation algorithm is used to improve the calculation accuracy. However, since this approach is limited by the sampling frequency of the ADC, it cannot detect small displacements, thus the LIDAR system is still subject to many limitations in detecting.

Therefore, how to effectively modulate highly random laser signals and reduce the limitation brought by the sampling frequency of the ADC without greatly increasing the cost of the LIDAR system is an important issue in this field.

SUMMARY

A LIDAR system is provided in present disclosure. The LIDAR system comprises a chaotic signal generating device, a signal transmitting device and a signal processing system. The chaotic signal generating device is configured to generate a chaotic signal and comprises a laser generator and a feedback device. The laser generator is configured to generate a laser signal. The feedback device is coupled to the laser generator, and configured to receive the laser signal, generate the chaotic signal and a feedback signal according to the laser signal, and transmit the adjusted feedback signal to the laser generator. The signal transmitting device is coupled to the chaotic signal generating device, and configured to receive the chaotic signal and generate a reference signal and a detection signal according to the chaotic signal, wherein the detection signal is transformed into a reflected signal after reflected by an obstacle. The signal processing system is coupled to the signal transmitting device, and configured to receive the reference signal and the reflected signal, and determine a delay time according to the reference signal and the reflected signal by using a frequency domain phase modulation algorithm.

An operating method for a LIDAR system is provided in present disclosure. The LIDAR system comprises a chaotic signal generating device, a signal transmitting device and a signal processing system. The operating method comprises: (a) generating a chaotic signal by the chaotic signal generating device; (b) generating a reference signal and a detection signal according to the chaotic signal by the signal transmitting device, wherein the detection signal is transformed into a reflected signal after being reflected by an obstacle; and (c) receiving the reference signal and the reflected signal, and determining a delay time according to the reference signal and the reflected signal by using a frequency domain phase modulation algorithm, by the signal processing system.

Through the LIDAR system and the operation method of the same, it is possible to modulate chaotic signals with high randomness and high anti-interference, without using high-speed modulators, and it is possible to break through the sampling frequency limitation of the ADC and sense small displacements, thereby improving the accuracy of the LIDAR system.

It should be understood that both the foregoing general description and the following detailed description are by examples, and are intended to provide further explanation of the disclosure as claimed.

BRIEF DESCRIPTION OF THE DRAWINGS

FIG. 2A is a flowchart of an operating method for the LIDAR system in accordance with some embodiments of the present disclosure.

FIG. 2C is a detailed flowchart of step 212 in FIG. 2B.

FIG. 2E is a detailed flowchart of step 230 in FIG. 2A.

FIG. 4 is a flowchart of a frequency domain phase modulation algorithm in accordance with some embodiments of the present disclosure.

DETAILED DESCRIPTION

Figure 1:
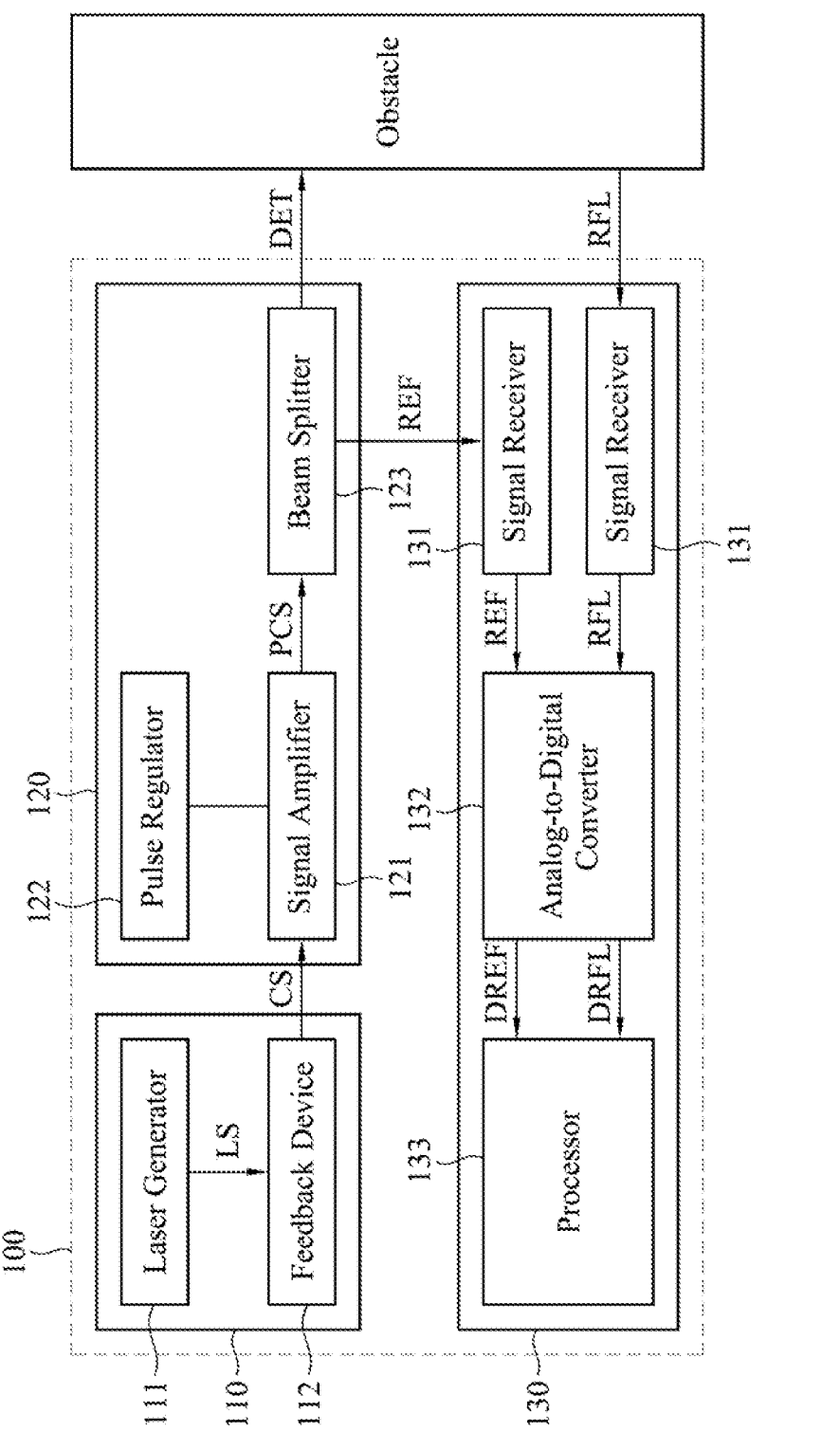
FIG. 1 is a simplified functional block diagram of a LIDAR system in accordance with some embodiments of the present disclosure.

Reference will now be made in detail to the embodiments of the present disclosure, examples of which are illustrated in the accompanying drawings. In the drawings, the same labels represent the same or similar elements or methods.

In the present disclosure, when a component is referred to as "connected", it may mean "electrical connected" or "optical connected"; when a component is referred to as a "coupled", it may mean "electrical coupled" or "optical coupled". The term "coupled" or "connected" used throughout the present disclosure may refer to two or more elements physically or optically contact with each other in direct, or physically or optically contact with each other in indirect, or two or more elements interact or act on each other. Unless the article is specifically limited in the present disclosure, "a" and "the" can generally refer to one or more. It will be further understood that the terms "comprising", "including", "having" and similar words used herein indicate the features, regions, integers, steps, operations, elements and/or components described therein, but do not exclude one or more other features, regions, integers, steps, operations, elements, components and/or groups thereof.

FIG. 1 is a simplified functional block diagram of a LIDAR system 100 in accordance with some embodiments of the present disclosure. In some embodiments, the LIDAR system 100 comprises a chaotic signal generating device 110, a signal transmitting device 120 and a signal processing system 130, wherein the chaotic signal generating device 110 is coupled to the signal transmitting device 120, and the signal transmitting device 120 is coupled to the signal processing system 130.

In order to clarify the operations of the LIDAR system 100, please refer to FIG. 1 and FIG. 2A together. FIG. 2A is a flowchart of an operating method 200 for the LIDAR system 100 in accordance with some embodiments of the present disclosure. In some embodiments, the operating method 200 comprises steps 210, 220 and 230.

In step 210, the chaotic signal generating device 110 is configured to generate a chaotic signal CS and transmit the chaotic signal CS to the signal transmitting device 120.

In step 220, the signal transmitting device 120 is configured to receive the chaotic signal CS, and generate a reference signal REF and a detection signal DET according to the chaotic signal CS, wherein the detection signal DET is transformed into a reflected signal RFL by being reflected by an obstacle after being transmitted by the signal transmitting device 120 and reaching the obstacle.

In step 230, the signal processing system 130 is configured to receive the reference signal REF and the reflected signal RFL, and determine a delay time of the LIDAR system 100 according to the reference signal REF and the reflected signal RFL by using a frequency domain phase modulation algorithm 400. The detailed operations of the frequency domain phase modulation algorithm 400 will be explained in the following paragraphs.

Figure 2B:
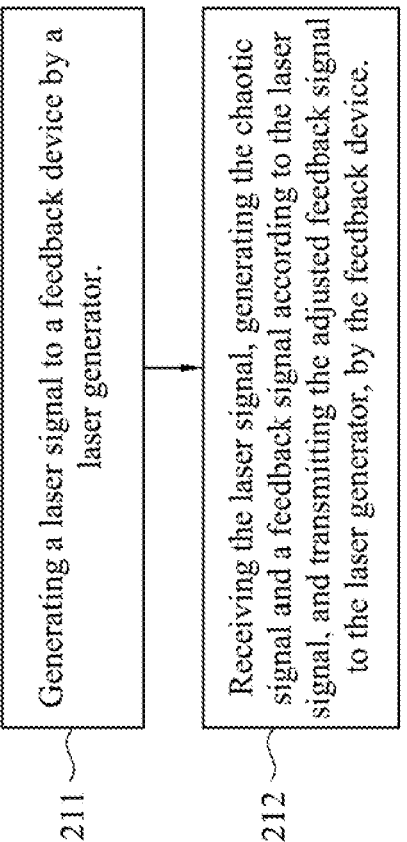
FIG. 2B is a detailed flowchart of step 210 in FIG. 2A.

In some embodiments, the chaotic signal generating device 110 comprises a laser generator 111 and a feedback device 112 coupled to each other. In order to clarify the operations of the chaotic signal generating device 110, please refer to FIG. 1 and FIG. 2B together. FIG. 2B is a detailed flowchart of step 210 in FIG. 2A. In some embodiments, step 210 further comprises steps 211 and 212.

In step 211, the laser generator 111 is configured to generate a laser signal LS to the feedback device 112.

In step 212, the feedback device 112 is configured to receive the laser signal LS, generate the chaotic signal CS and a feedback signal FB according to the laser signal LS, and transmit the adjusted feedback signal FB to the laser generator 111.

Figure 3:
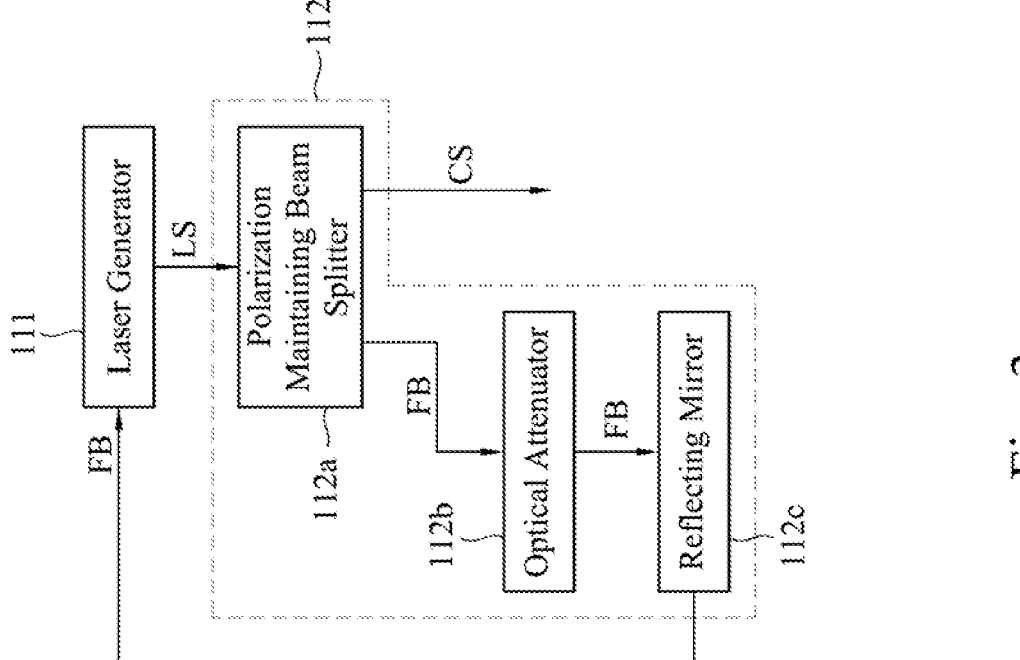
FIG. 3 is a simplified functional block diagram of a chaotic signal generating device in accordance with some embodiments of the present disclosure.

Regarding the internal structure of the feedback device 112, please refer to FIG. 3. FIG. 3 is a simplified functional block diagram of the chaotic signal generating device 110 in accordance with some embodiments of the present disclosure. In some embodiments, the feedback device 112 comprises a polarization maintaining beam splitter 112a, an optical attenuator 112b and a reflecting mirror 112c, wherein the polarization maintaining beam splitter 112a, the optical attenuator 112b and the reflecting mirror 112c are arranged on the same optical transmission path.

In order to clarify the operations of the feedback device 112, please refer to FIG. 2C and FIG. 3 together. FIG. 2C is a detailed flowchart of step 212 in FIG. 2B. In some embodiments, step 212 further comprises steps 212a, 212b and 212c.

In step 212a, the polarization maintaining beam splitter 112a is configured to receive the laser signal LS from the laser generator 111 and split the laser signal LS into the feedback signal FB and the chaotic signal CS. In some embodiments, the intensity (i.e., amplitude) of the feedback signal FB is lower than the intensity of the chaotic signal CS.

In step 212b, the optical attenuator 112b is configured to receive the feedback signal FB, adjust the intensity of the feedback signal FB according to an attenuation parameter, and transmit the adjusted feedback signal FB to the reflecting mirror 112c. For example, when the attenuation parameter is 0.5, the optical attenuator 112b can adjust the intensity of the feedback signal FB to 0.5 times of the original and send it to the reflecting mirror 112c.

In step 212c, the reflecting mirror 112c is configured to receive the feedback signal FB adjusted by the optical attenuator 112b, and reflect the adjusted feedback signal FB to the laser generator 111, so as to finish an external feedback. Through the external feedback, the laser signal LS can be modulated, which is helpful for generating the chaotic signal CS having random waveform and intensity.

In some embodiments, the optical feedback intensity is related to the attenuation parameter set in the optical attenuator 112b, and the optical feedback delay time is in positive correlation with the distance between the optical attenuator 112b and the reflecting mirror 112c.

The chaotic signal CS generated by the feedback device 112 is random and unpredictable, thus the LIDAR system 100 can resist interference from other LIDAR systems. In addition, since the feedback device 112 does not need to comprise a high-speed modulator, the complexity of the LIDAR system 100 can be effectively reduced, and therefore the cost of the LIDAR system 100 can be reduced.

Please refer to FIG. 1 again. In some embodiments, the signal transmitting device 120 comprises a signal amplifier 121, a pulse regulator 122 and a beam splitter 123, wherein the signal amplifier 121 is coupled to the pulse regulator 122 and the beam splitter 123.

Figure 2D:
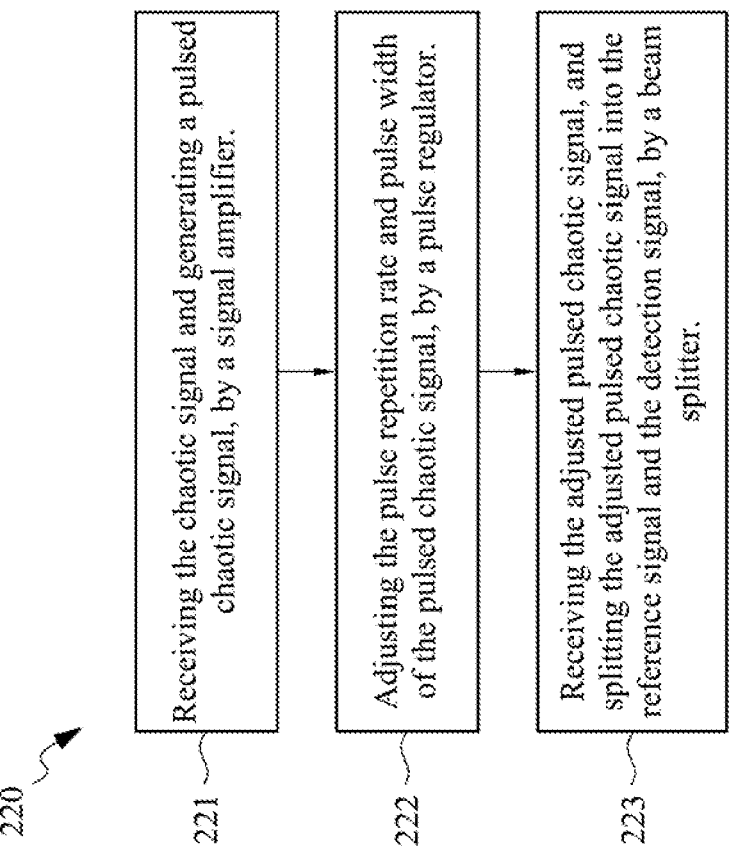
FIG. 2D is a detailed flowchart of step 220 in FIG. 2A.

In order to clarify the operations of the signal transmitting device 120 and the detailed operations of step 220 in FIG. 2A, please refer to FIG. 1 and FIG. 2D together. FIG. 2D is a detailed flowchart of step 220 in FIG. 2A. In some embodiments, step 220 further comprises steps 221, 222 and 223.

In step 221, the signal amplifier 121 is configured to receive the chaotic signal CS, and generate a pulsed chaotic signal PCS. Compared with the traditional LIDAR system using the continuous wave, the LIDAR system 100 using the pulsed chaotic signal PCS can achieve higher peak power, thereby realizing wider applications.

In step 222, the pulse regulator 122 is configured to adjust the pulse repetition rate and pulse width of the pulsed chaotic signal PCS to meet application requirements.

In step 223, the beam splitter 123 is configured to receive the adjusted pulsed chaotic signal PCS, and split the adjusted pulsed chaotic signal PCS into the reference signal REF and the detection signal DET. In some embodiments, the intensity of the reference signal REF is lower than the intensity of the detection signal DET.

Please refer to FIG. 1 again. In some embodiments, the signal processing system 130 comprises two signal receivers 131, an analog-to-digital converter (ADC) 132 and a processor 133, wherein the two signal receivers 131 are coupled to the ADC 132, and the ADC 132 is coupled to the processor 133.

In order to clarify the operations of the signal processing system 130 and the detailed operations of step 230 in FIG. 2A, please refer to FIG. 1 and FIG. 2E together. FIG. 2E is a detailed flowchart of step 230 in FIG. 2A. In some embodiments, step 230 further comprises steps 231, 232 and 233.

In step 231, the two signal receivers 131 are configured to respectively receive the reference signal REF and the reflected signal RFL, and respectively transmit the reference signal REF and the reflected signal RFL to the ADC 132. In some embodiments, each of the two signal receivers 131 can be implemented by an avalanche photodiode (APD).

In step 232, the ADC 132 is configured to receive the reference signal REF and the reflected signal RFL, convert the reference signal REF and the reflected signal RFL from analog signals to digital signals, and transmit the converted digital reference signal DREF and the converted digital reflected signal DRFL to the processor 133.

In step 233, the processor 133 is configured to receive the digital reference signal DREF and the digital reflected signal DRFL, and determine the delay time of the LIDAR system 100 according to the digital reference signal DREF and the digital reflected signal DRFL by using the frequency domain phase modulation algorithm 400.

In some embodiments, the processor 133 can be implemented with a central processing unit (CPU), a microprocessor, a multi-processor, other similar devices or any combination of the above devices. In some embodiments, the processor 133 comprises a memory component configured to store the frequency domain phase modulation algorithm 400, wherein the memory component can be implemented with a dynamic random access memory (DRAM), a static random access memory (SRAM), a read only memory (ROM) or other components with storage function.

It should be noted that the number and order of steps in the operating method 200 in present disclosure are only examples, and are not intended to limit the present disclosure. The other number and order of steps in the operating method 200 are within the scope of the present disclosure. In some embodiments, steps 221 and 222 can be synchronously performed. In some embodiments, step 222 can be omitted.

In order to clarify the operations of the frequency domain phase modulation algorithm 400, please refer to FIG. 4. FIG. 4 is a flowchart of the frequency domain phase modulation algorithm 400 in accordance with some embodiments of the present disclosure. In some embodiments, the frequency domain phase modulation algorithm 400 comprises steps 410, 420, 430, 440 and 450.

Figure 5A:
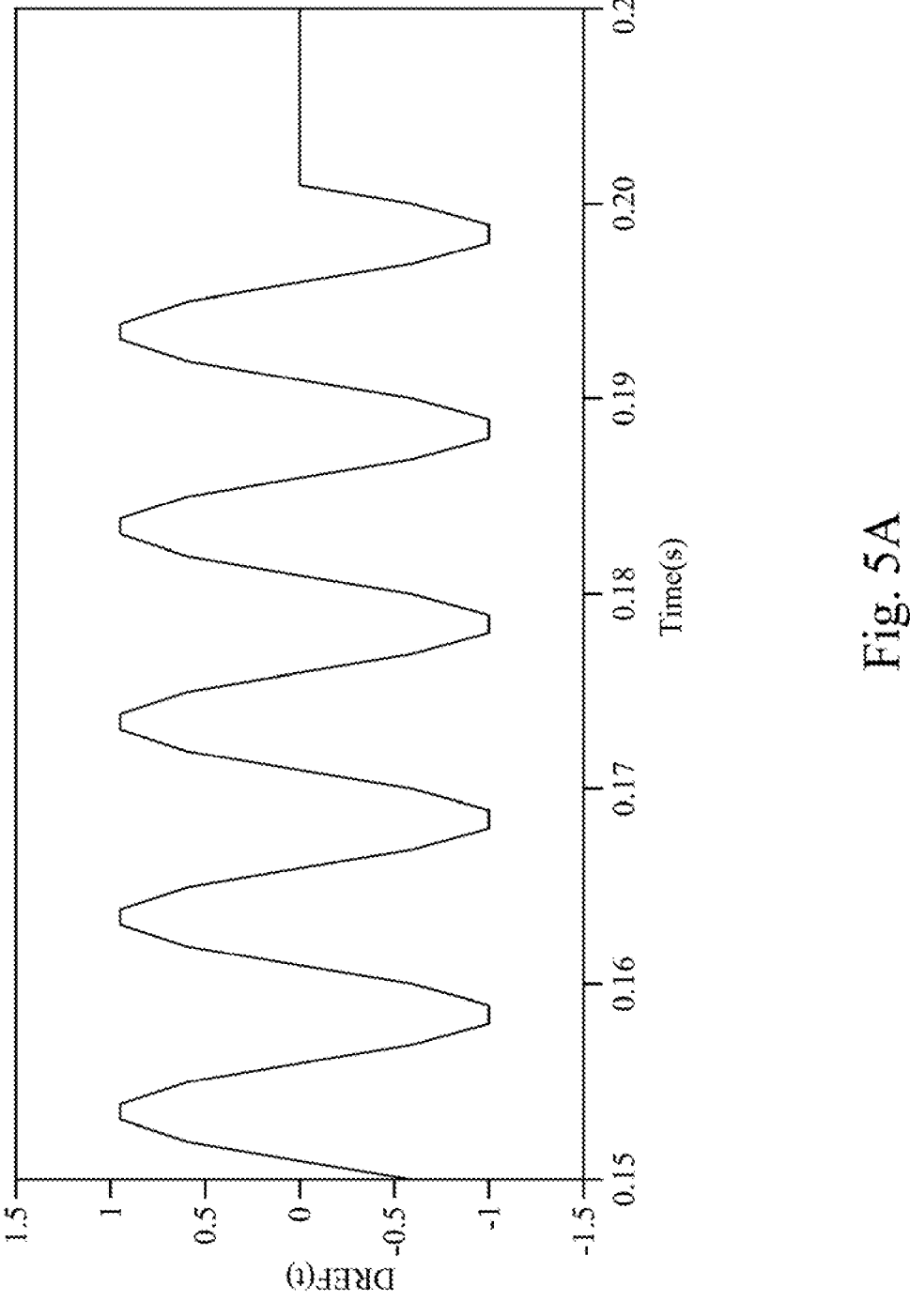
FIG. 5A is a wave diagram of a digital reference signal in time-domain in accordance with some embodiments of the present disclosure.
Figure 5B:
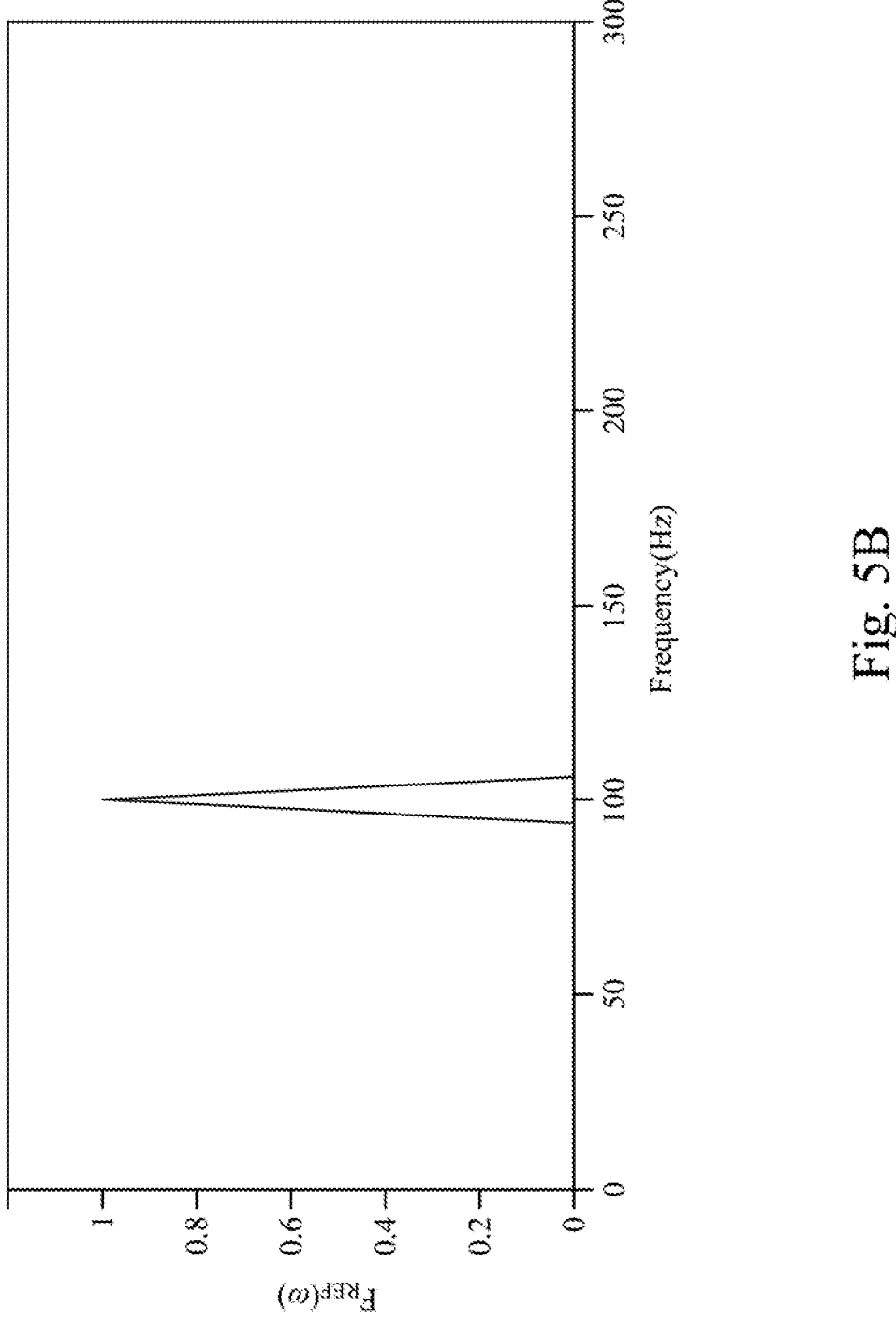
FIG. 5B is a wave diagram of a reference signal in frequency-domain in accordance with some embodiments of the present disclosure.

In step 410, the processor 133 converts the digital reference signal DREF from a time-domain signal to a frequency-domain reference signal $F_{REF}(\omega)$ (i.e., a frequency-domain signal) through Fourier transformation. Please refer to FIG. 5A and FIG. 5B together. FIG. 5A is a wave diagram of the digital reference signal DREF in time-domain in accordance with some embodiments of the present disclosure. FIG. 5B is a wave diagram of the frequency-domain reference signal $F_{REF}(\omega)$ in frequency-domain in accordance with some embodiments of the present disclosure.

In step 420, the processor 133 presets a plurality of delay times, and calculates a plurality of phase modulation signals $F'_{REF}(\omega)$ corresponding to the plurality of delay times through Formula 1 according to the frequency domain reference signal $F_{REF}(\omega)$ and a signal frequency. The calculation formula of Formula 1 is as follows:

$$F'_{REF}(\omega) = F_{REF}(\omega) * e^{-i\phi}, \phi = 2\pi f t_{shift} \tag{1}$$

Wherein $t_{shift}$ represents the delay time, and f represents the signal frequency of the digital reference signal DREF.

Figure 5C:
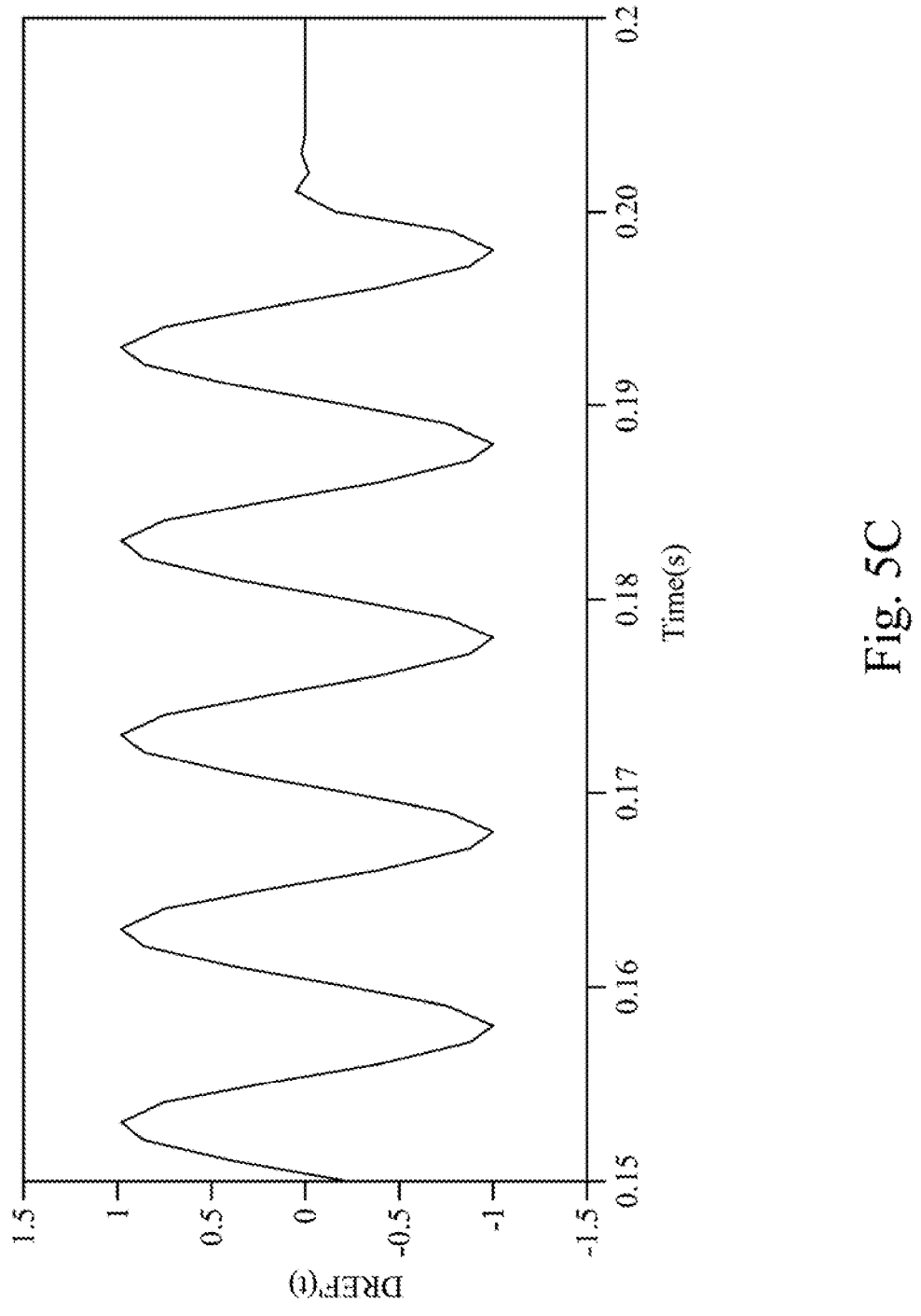
FIG. 5C is a wave diagram of a shifted reference signal in time-domain in accordance with some embodiments of the present disclosure.

In step 430, the processor 133 converts the plurality of phase modulated signals $F'_{REF}(\omega)$ from frequency-domain signals to time-domain signals through inverse Fourier transformation, so as to obtain a plurality of shifted reference signals DREF' corresponding to the plurality of delay times. Please refer to FIG. 5C. FIG. 5C is a wave diagram of a shifted reference signal DREF' in time-domain in accordance with some embodiments of the present disclosure.

In step 440, the processor 133 applies a cross-correlation function (i.e., similarity comparison) on each of the plurality of shifted reference signals DREF' and the digital reflected signal DRFL, so as to calculate a plurality of similarity parameters.

In step 450, the processor 133 selects the largest one of the plurality of similarity parameters, and takes the delay time corresponding to the shifted reference signal DREF' corresponding to this similarity parameter as the delay time of the LIDAR system 100. In some embodiments, the processor 133 is further configured to calculate the distance error of the LIDAR system 100 according to the delay time.

Through the frequency domain phase modulation algorithm 400, the digital reflected signal DRFL can be modulated after being converted to the frequency-domain. Therefore, a phase shift can be performed without being limited by the sampling frequency, so as to obtain the phase modulated signal $F'_{REF}(\omega)$ whose shift is smaller than the sampling period, thereby improving the precision of the LIDAR system 100.

In conclusion, the LIDAR system 100 and the operating method 200 of the present disclosure achieve improvements in different aspects by integrating hardware and software systems. In aspect of hardware, the LIDAR system 100 of the present disclosure can modulate chaotic signals with high randomness without using high-speed modulators, so as to improve anti-interference and reduce the system complexity and manufacturing cost. In aspect of software, the LIDAR system 100 of the present disclosure breaks through the limitation of the sampling frequency of the ADC by using the frequency domain phase modulation algorithm, thus the LIDAR system 100 can sense small displacements, thereby improving the sensing accuracy.

The above are preferred embodiments of the present disclosure, and various modifications and equivalent changes may be made to the structure of the present disclosure without departing from the scope or spirit of the present disclosure. In view of the foregoing, it is intended that the present disclosure cover modifications and variations of this invention provided they fall within the scope of the following claims.

What is claimed is:

1. A LIDAR system, comprising:
a chaotic signal generating device, configured to generate a chaotic signal, comprising:
a laser generator, configured to generate a laser signal; and
a feedback device, coupled to the laser generator, and configured to receive the laser signal, generate the chaotic signal and a feedback signal according to the laser signal, and transmit the adjusted feedback signal to the laser generator;
a signal transmitting device, coupled to the chaotic signal generating device, and configured to receive the chaotic signal and generate a reference signal and a detection signal according to the chaotic signal, wherein the detection signal is transformed into a reflected signal after being reflected by an obstacle; and
a signal processing system, coupled to the signal transmitting device, and configured to receive the reference signal and the reflected signal, and determine a delay time according to the reference signal and the reflected signal by using a frequency domain phase modulation algorithm.

2. The LIDAR system of claim 1, wherein the feedback device comprises:
a polarization maintaining beam splitter, configured to split the laser signal into the feedback signal and the chaotic signal;
an optical attenuator, configured to receive the feedback signal, and adjust the intensity of the feedback signal according to an attenuation parameter; and
a reflecting mirror, configured to receive the feedback signal from the optical attenuator, and reflect the feedback signal to the laser generator,
wherein the polarization maintaining beam splitter, the optical attenuator and the reflecting mirror are arranged on the same optical transmission path,
wherein the intensity of the feedback signal is lower than the intensity of the chaotic signal.

3. The LIDAR system of claim 1, wherein the signal transmitting device comprises:
a signal amplifier, configured to receive the chaotic signal and generate a pulsed chaotic signal;
a pulse regulator, coupled to the signal amplifier, and configured to adjust the pulse repetition rate and pulse width of the pulsed chaotic signal; and
a beam splitter, coupled to the signal amplifier, and configured to split the pulsed chaotic signal into the reference signal and the detection signal,
wherein the intensity of the reference signal is lower than the intensity of the detection signal.

4. The LIDAR system of claim 1, wherein the signal processing system comprises:
two signal receivers, configured to respectively receive the reference signal and the reflected signal;
an analog-to-digital converter, coupled to the two signal receivers, and configured to convert the reference signal and the reflected signal from analog signals to a digital reference signal and a digital reflected signal, respectively; and
a processor, coupled to the analog-to-digital converter, and configured to determine the delay time according to the digital reference signal and the digital reflected signal by using the frequency domain phase modulation algorithm.

5. The LIDAR system of claim 4, wherein each of the two signal receivers is an avalanche photodiodes.

6. The LIDAR system of claim 4, wherein when the signal processing system uses the frequency domain phase modulation algorithm to determine the delay time, the signal processing system is configured for:
converting the digital reference signal from a time-domain signal to a frequency-domain reference signal through Fourier transformation;
calculating a plurality of phase modulated signals according to the frequency-domain reference signal, a signal frequency and a plurality of delay times;
converting the plurality of phase modulated signals from frequency-domain signals to a plurality of time-domain shifted reference signals through inverse Fourier transformation;
calculating a plurality of similarity parameters according to the plurality of shifted reference signals and the digital reflected signal; and
selecting the delay time corresponding to the shifted reference signal corresponding to the largest one of the plurality of similarity parameters as the delay time of the LIDAR system.

7. The LIDAR system of claim 4, wherein the processor comprises a memory component, wherein the memory component is configured to store the frequency domain phase modulation algorithm.

8. An operating method for a LIDAR system, wherein the LIDAR system comprises a chaotic signal generating device, a signal transmitting device and a signal processing system, the operating method comprises:
(a) generating a chaotic signal by the chaotic signal generating device;
(b) generating a reference signal and a detection signal according to the chaotic signal by the signal transmitting device, wherein the detection signal is transformed into a reflected signal after being reflected by an obstacle; and
(c) receiving the reference signal and the reflected signal, and determining a delay time according to the reference signal and the reflected signal by using a frequency domain phase modulation algorithm, by the signal processing system.

9. The operating method of claim 8, wherein step (a) comprises:
(a1) generating a laser signal by a laser generator of the chaotic signal generating device; and
(a2) generating the chaotic signal and a feedback signal according to the laser signal, and transmitting the adjusted feedback signal to the laser generator, by a feedback device of the chaotic signal generating device.

10. The operating method of claim 9, wherein step (a2) comprises:
splitting the laser signal into the feedback signal and the chaotic signal by a polarization maintaining beam splitter of the feedback device;
receiving the feedback signal, and adjusting the intensity of the feedback signal according to an attenuation parameter, by an optical attenuator of the feedback device; and
receiving the feedback signal from the optical attenuator, and reflecting the feedback signal to the laser generator, by a reflecting mirror of the feedback device,
wherein the polarization maintaining beam splitter, the optical attenuator and the reflecting mirror are arranged on the same optical transmission path, wherein the intensity of the feedback signal is lower than the intensity of the chaotic signal.

11. The operating method of claim 8, wherein step (b) comprises:

receiving the chaotic signal and generating a pulsed chaotic signal by a signal amplifier of the signal transmitting device;

adjusting the pulse repetition rate and pulse width of the pulsed chaotic signal by a pulse regulator of the signal transmitting device; and splitting the pulsed chaotic signal into the reference signal and the detection signal by a beam splitter of the signal transmitting device, wherein the intensity of the reference signal is lower than the intensity of the detection signal.

12. The operating method of claim 8, wherein step (c) comprises:

(c1) receiving the reference signal and the reflected signal respectively by two signal receivers of the signal processing system;

(c2) converting the reference signal and the reflected signal from analog signals to a digital reference signal and a digital reflected signal, respectively, by an analog-to-digital converter of the signal processing system; and (c3) determining the delay time according to the digital reference signal and the digital reflected signal by using the frequency domain phase modulation algorithm, by a processor of the signal processing system.

13. The operating method of claim 12, wherein each of the two signal receivers is an avalanche photodiodes.

14. The operating method of claim 12, wherein step (c3) comprises:

converting the digital reference signal from a time-domain signal to a frequency-domain reference signal through Fourier transformation;

calculating a plurality of phase modulated signals according to the frequency-domain reference signal, a signal frequency and a plurality of delay times;

converting the plurality of phase modulated signals from frequency-domain signals to a plurality of time-domain shifted reference signals through inverse Fourier transformation;

calculating a plurality of similarity parameters according to the plurality of shifted reference signals and the digital reflected signal; and selecting the delay time corresponding to the shifted reference signal corresponding to the largest one of the plurality of similarity parameters as the delay time of the LIDAR system.

15. The operating method of claim 12, wherein step (c3) comprises:

accessing the frequency domain phase modulation algorithm from a memory component of the processor.

\* \* \* \* \*